(12) United States Patent
Lee et al.

(10) Patent No.: US 12,044,448 B2
(45) Date of Patent: Jul. 23, 2024

(54) ELECTROCALORIC HEAT TRANSFER SYSTEM AND METHOD OF OPERATING THE SAME

(71) Applicant: Carrier Corporation, Palm Beach Gardens, FL (US)

(72) Inventors: Yongduk Lee, Vernon, CT (US); Joseph V. Mantese, Ellington, CT (US); Subramanyaravi Annapragada, South Windsor, CT (US); Wei Xie, Malden, MA (US); Luis Arnedo, South Glastonbury, CT (US); Vladimir Blasko, Avon, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 571 days.

(21) Appl. No.: 17/059,749

(22) PCT Filed: Nov. 19, 2019

(86) PCT No.: PCT/US2019/062211
§ 371 (c)(1),
(2) Date: Nov. 30, 2020

(87) PCT Pub. No.: WO2020/106718
PCT Pub. Date: May 28, 2020

(65) Prior Publication Data
US 2021/0372672 A1    Dec. 2, 2021

Related U.S. Application Data

(60) Provisional application No. 62/769,261, filed on Nov. 19, 2018.

(51) Int. Cl.
*F25B 21/00*    (2006.01)
*F25B 49/00*    (2006.01)
*H03K 17/687*    (2006.01)

(52) U.S. Cl.
CPC .............. *F25B 21/00* (2013.01); *F25B 49/00* (2013.01); *H03K 17/687* (2013.01);
(Continued)

(58) Field of Classification Search
CPC ......... H03K 17/687; H03K 2217/0063; H03K 2217/0072; F25B 21/00; F25B 21/02; F25B 49/00; F25B 2321/001
See application file for complete search history.

(56) References Cited

U.S. PATENT DOCUMENTS 6,877,325 B1 *    4/2005    Lawless ................. F25B 21/00
                                                        62/3.1
7,050,312 B2    5/2006    Tracy et al.
(Continued)

FOREIGN PATENT DOCUMENTS

EP    3333505 A1    6/2018
WO    2017111918 A1    6/2017
WO    2020106718 A1    5/2020

OTHER PUBLICATIONS

International Search Report for International Application No. PCT/US2019/062211; Application Filing Date: Nov. 19, 2019; Date of Mailing: Mar. 6, 2020: 6 pages.
(Continued)

*Primary Examiner* — Mayla Gonzalez Ramos
(74) *Attorney, Agent, or Firm* — CANTOR COLBURN LLP

(57) ABSTRACT

A heat transfer system (310) is disclosed that includes a first electrocaloric module (62) comprising a first electrocaloric material, a first high-side voltage electrode, and a first low-side voltage electrode, arranged to impart an electric field to the electrocaloric material. The system also includes a second electrocaloric module (64) comprising a second electrocaloric material, a second high-side voltage electrode, and a second low-side voltage electrode, arranged to impart
(Continued)

an electric field to the electrocaloric material. A bi-directional power transfer circuit (60) is also included arranged to alternately transfer power from the electrodes of the first electrocaloric module (62) to the second electrocaloric module (64), and from the electrodes of the second electrocaloric module (64) to the first electrocaloric module (62).

20 Claims, 5 Drawing Sheets

(52) U.S. Cl.
CPC .................. *F25B 2321/001* (2013.01); *H03K 2217/0063* (2013.01); *H03K 2217/0072* (2013.01)

(56) References Cited

U.S. PATENT DOCUMENTS

| | | |
|---|---|---|
| 8,593,115 B2 | 11/2013 | Walter et al. |
| 8,695,353 B2 | 4/2014 | Casasanta |
| 9,109,818 B2 | 8/2015 | Schwartz et al. |
| 9,157,669 B2 | 10/2015 | Kruglick |
| 9,310,109 B2 | 4/2016 | Kruglick |
| 9,356,536 B2 | 5/2016 | Bala et al. |
| 9,429,344 B2 | 8/2016 | Schwartz et al. |
| 9,791,181 B2 | 10/2017 | Defay et al. |
| 2010/0037624 A1 | 2/2010 | Epstein et al. |
| 2014/0345296 A1* | 11/2014 | Defay .................... F25B 21/00 62/3.1 |
| 2017/0146270 A1 | 5/2017 | Colognesi |
| 2018/0164001 A1 | 6/2018 | Schwartz et al. |

OTHER PUBLICATIONS

Written Opinion for International Application No. PCT/US2019/062211; Application Filing Date: Nov. 19, 2019; Date of Mailing: Mar. 6, 2020; 9 pages.

\* cited by examiner

ELECTROCALORIC HEAT TRANSFER
SYSTEM AND METHOD OF OPERATING
THE SAME

CROSS REFERENCE TO RELATED APPLICATIONS

This application is a National Stage application of PCT/US2019/062211, filed Nov. 19, 2019, which claims the benefit of U.S. Provisional Application No. 62/769,261, filed Nov. 19, 2018, both of which are incorporated by reference in their entirety herein.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that includes a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities.

BRIEF DESCRIPTION

A heat transfer system is disclosed that includes a first electrocaloric module comprising a first electrocaloric material, a first high-side voltage electrode, and a first low-side voltage electrode, arranged to impart an electric field to the electrocaloric material. The system also includes a second electrocaloric module comprising a second electrocaloric material, a second high-side voltage electrode, and a second low-side voltage electrode, arranged to impart an electric field to the electrocaloric material. A bi-directional power transfer circuit is arranged to alternately transfer power from the electrodes of the first electrocaloric module to the second electrocaloric module, and from the electrodes of the second electrocaloric module to the first electrocaloric module. The bi-directional power transfer circuit includes an inductor disposed between and in operative electrical communication with the electrodes of the first and second electrocaloric modules, a first high-side switch in an electrical connection between the first high-side electrode and the inductor, a first low-side switch in an electrical connection between the first low-side electrode and the inductor, a second high-side switch in an electrical connection between the second high-side electrode and the inductor, and a second low-side switch in an electrical connection between the second low-side electrode and the inductor. An electric power source including a high-side voltage connection and a low-side voltage connection is in operative electrical communication with one or more of: the electrodes of first electrocaloric module, the electrodes of second electrocaloric module, or the bi-directional power transfer circuit.

In some embodiments, the system can further include a first low-side diode connected in parallel with the first low-side switch and oriented to conduct current from the first low-side voltage electrode to the first high-side voltage electrode, and a second low-side diode connected in parallel with the second low-side switch and oriented to conduct current from the second low-side voltage electrode to the second high-side voltage electrode.

In any one or combination of the foregoing embodiments, the system can further include a first high-side diode connected in parallel with the first high-side switch and oriented to conduct current from the first low-side voltage electrode to the first high-side voltage electrode, and a second high-side diode connected in parallel with the second high-side switch and oriented to conduct current from the second low-side voltage electrode to the second high-side voltage electrode.

In any one or combination of the foregoing embodiments, the system can further include a power source switch disposed in an electrical connection between the high-side voltage connection of the power source and the electrocaloric modules.

In any one or combination of the foregoing embodiments, the system can further include a power source diode connected in parallel with the power source switch and oriented to conduct current from the electrocaloric modules to the high-side voltage connection.

In any one or combination of the foregoing embodiments, the system can further include a high-side voltage bus connected to the power source high-side connection, a low-side voltage bus connected to the negative terminal, a plurality of electrocaloric modules that individually comprise an electrocaloric material, a high-side voltage electrode, and a low-side voltage electrode arranged to impart an electric field to the electrocaloric material, and a plurality of bi-directional power transfer circuits between each electrocaloric module and the high-side and low-side voltage buses that individually comprise a high-side switch and a low-side switch connected in series between the electrocaloric module high-side and low-side voltage electrodes, an inductor in an electrical connection between the high-side voltage bus and a junction disposed between the high-side switch and the low-side switch, and an electrical connection between the low-side voltage electrode and the low-side voltage bus.

In some embodiments, the power source switch can be between the power source high-side voltage connection and the high-side voltage bus.

In any one or combination of the foregoing embodiments, the system can further include a capacitor in an electrical connection between the power source high-side and low-side voltage connections, in parallel with electrical connections to the high-side and low-side voltage electrodes of the electrocaloric modules.

Also disclosed is a method of operating the heat transfer system of any one or combination of the preceding embodiments. The method includes: (a) applying a voltage differential to the electrodes of the first electrocaloric module to activate the first electrocaloric material; (b) transferring heat from the activated first electrocaloric material to a heat sink; (c) transferring electric power from the first electrocaloric module electrodes to the second electrocaloric module electrodes through the bi-directional power transfer circuit to deactivate the first electrocaloric material and activate the second electrocaloric material; and (d) transferring heat from a heat source to the deactivated first electrocaloric material, and transferring heat from the activated second electrocaloric material to the heat sink.

In any one or combination of the foregoing embodiments, the method can further include transferring electric power from the power source to either or both of the first electrocaloric module electrodes or the second electrocaloric module electrodes.

In any one or combination of the foregoing embodiments, the method further includes: (e) transferring electric power from the second electrocaloric module electrodes to the first electrocaloric module electrodes through the bi-directional power transfer circuit to deactivate the second electrocaloric material and activate the first electrocaloric material; and (f) transferring heat from the heat source to the deactivated second electrocaloric material, and transferring heat from the activated first electrocaloric material to the heat sink.

In any one or combination of the foregoing embodiments, the method can further include repeating steps (c)-(f).

In any one or combination of the foregoing embodiments, step (c) can further include closing the second high-side switch, opening the first low-side switch, closing the first high-side switch, and closing the second low-side switch.

In any one or combination of the foregoing embodiments, the method can further include toggling the first high-side switch together with the second low-side switch between open and closed positions.

In any one or combination of the foregoing embodiments, the first high-side switch and the second low-side switch can be toggled together between open and closed positions in a pulse width modulation pattern to produce a constant current through the inductor.

In any one or combination of the foregoing embodiments, the first high-side switch and the second low-side switch can be toggled together between open and closed positions in a pulse width modulation pattern to produce a sine wave current through the inductor.

In some embodiments, the step (e) can include closing the first high-side switch, opening the second low-side switch, closing the second high-side switch, and closing the first low-side switch.

In some embodiments, the method can further include toggling the second high-side switch together with the first low-side switch between open and closed positions.

In some embodiments, the second high-side switch and the first low-side switch can be toggled together between open and closed positions in a pulse width modulation pattern to produce a constant current through the inductor.

In some embodiments, the second high-side switch and the first low-side switch can be toggled together between open and closed positions in a pulse width modulation pattern to produce a sine wave current through the inductor.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
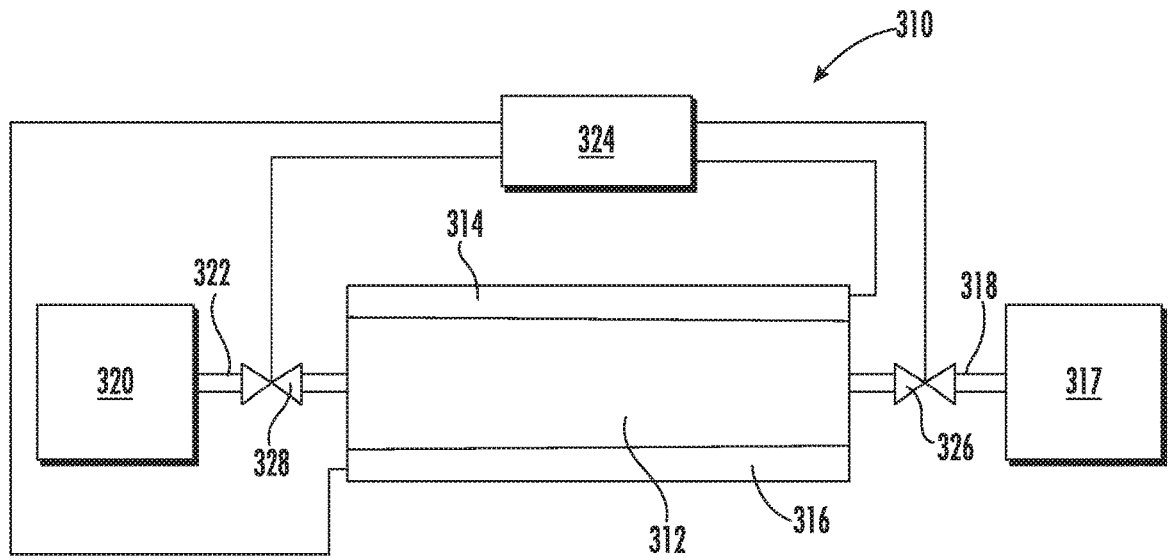
FIG. 1 is a schematic depiction of an example embodiment of an electrocaloric heat transfer system.

An example embodiment of a heat transfer system and its operation are described with respect to FIG. 1. As shown in FIG. 1, a heat transfer system 310 comprises an electrocaloric material 312 with first and second electrical buses 314 and 316 in electrical communication with electrodes on the electrocaloric material. The electrocaloric material 312 is in thermal communication with a heat sink 317 through a first thermal flow path 318, and in thermal communication with a heat source 320 through a second thermal flow path 322. The thermal flow paths can be described with respect thermal transfer through flow of working fluid through control devices 326 and 328 (e.g., flow dampers or valves) between the stack and the heat sink and heat source. A controller 324 is configured to control electrical current to through a power source (not shown) to selectively activate the buses 314, 316. In some embodiments, the electrocaloric material can be activated by energizing one bus bar/electrode while maintaining the other bus bar/electrode at a ground voltage. The controller 324 is also configured to open and close control devices 326 and 328 to selectively direct the working fluid along the first and second flow paths 318 and 322.

In operation, the system 310 can be operated by the controller 324 applying an electric field as a voltage differential across the electrocaloric material 312 in the stack to cause a decrease in entropy and a release of heat energy by the electrocaloric material 312. The controller 324 opens the control device 326 to transfer at least a portion of the released heat energy along flow path 318 to heat sink 317. This transfer of heat can occur after the temperature of the electrocaloric material 312 has risen to a threshold temperature. In some embodiments, heat transfer to the heat sink 317 is begun as soon as the temperature of the electrocaloric material 312 increases to be about equal to the temperature of the heat sink 317. After application of the electric field for a time to induce a desired release and transfer of heat energy from the electrocaloric material 312 to the heat sink 317, the electric field can be removed. Removal of the electric field causes an increase in entropy and a decrease in heat energy of the electrocaloric material 312. This decrease in heat energy manifests as a reduction in temperature of the electrocaloric material 312 to a temperature below that of the heat source 320. The controller 324 closes control device 326 to terminate flow along flow path 318, and opens control device 328 to transfer heat energy from the heat source 320 to the colder electrocaloric material 312 in order to regenerate the electrocaloric material 312 for another cycle.

In some embodiments, for example where a heat transfer system is utilized to maintain a temperature in a conditioned space or thermal target, the electric field can be applied to the electrocaloric material 312 to increase temperature until the temperature reaches a first threshold. After the first temperature threshold, the controller 324 opens control device 326 to transfer heat from the stack to the heat sink 317 until a second temperature threshold is reached. The electric field can continue to be applied during all or a portion of the time period between the first and second temperature thresholds, and is then removed to reduce the temperature until a third temperature threshold is reached. The controller 324 then closes control device 326 to terminate heat flow transfer along heat flow path 318, and opens control device 328 to transfer heat from the heat source 320 to the stack. The above steps can be optionally repeated until a target temperature of the conditioned space or thermal target (which can be either the heat source or the heat sink) is reached.

In some embodiments, the electrocaloric material 312 referenced above can comprise an electrocaloric film connected to a frame. The frame can include various configurations, including but not limited to full peripheral frames (e.g., 'picture' frames) and components thereof, partial peripheral frames and components thereof, or internal frames and components thereof. In some embodiments, the frame can be part of a repeating modular structure that can be assembled along with a set of electrocaloric films in a stack-like fashion. In some embodiments, the frame can be a unitary structure equipped with one or more attachment points to receive one or more of electrocaloric films.

Figure 2:
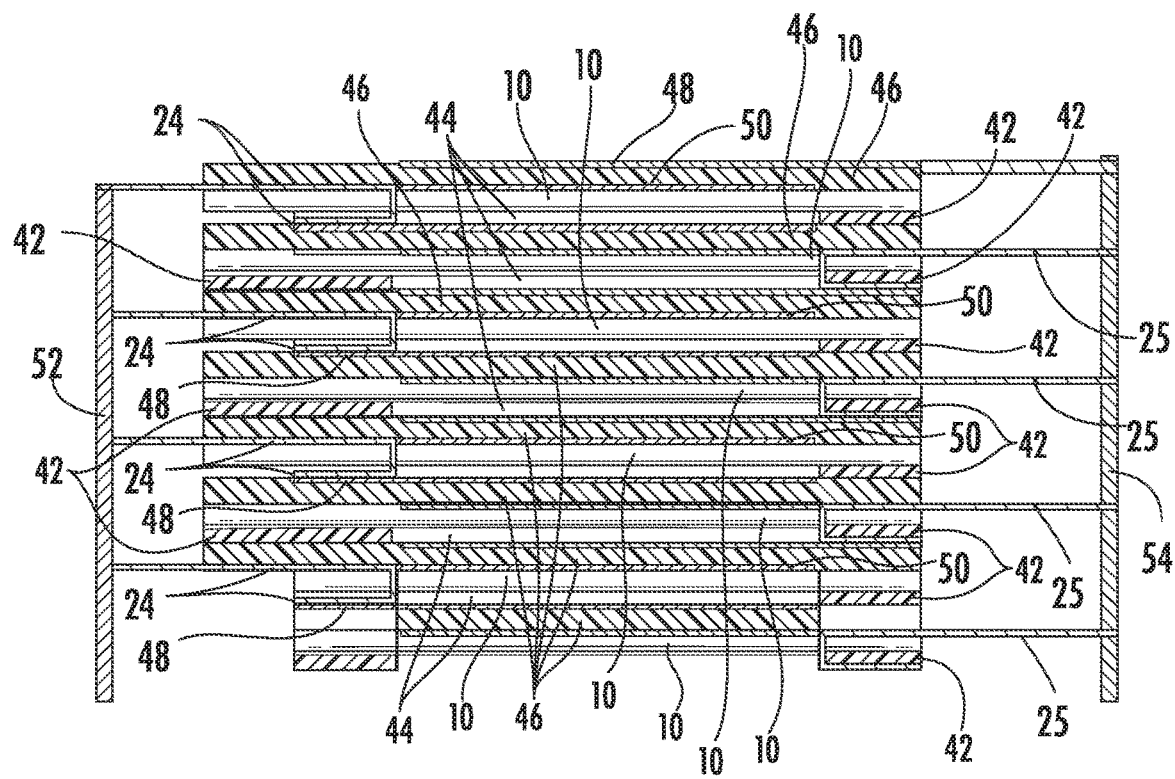
FIG. 2 schematically shows an example embodiment of a plurality of electrocaloric film segments in a stacked configuration.

In some embodiments, a heat transfer device can include a plurality of electrocaloric film segments in a stack configuration arranged to provide flow paths for a working fluid between adjacent electrocaloric film segments. A stack of repeating modular framed electrocaloric films 46 is schematically shown in a cross-sectional view in FIG. 2. The order of assembly can be varied and adapted to achieve target specifications, and the order shown in FIG. 2 is a typical example including peripheral frames 10, spacers 42, electrocaloric elements having electrocaloric films 46 with first electrodes 48 and second electrodes 50, and first and second electrically conductive elements 24, 25 electrically connected to the first and second electrodes 48, 50 and to first and second electrical buses 52, 54, respectively. As shown in FIG. 2, the electrocaloric films are disposed in the stack with a configuration such that the relative (top/bottom) orientation of the first and second electrodes 48, 50 is alternated with adjacent films so that each fluid flow path 44 has electrodes of matching polarity on each side of the fluid flow path 44, which can inhibit arcing across the flow path gap.

It should be noted that although FIG. 2 discloses individual segments of electrocaloric film attached to a peripheral frame in a picture-frame configuration, other configurations of electrocaloric articles can be utilized such as electrocaloric articles formed from a continuous sheet of electrocaloric film, or different frame configurations such as internal frame components (e.g., stack spacers) or peripheral frames covering less than the full perimeter of the electrocaloric film, or combinations of the above features with each other or other features. Continuous sheets of electrocaloric film can be dispensed directly from a roll and manipulated by bending back and forth into a stack-like configuration, or can be cut into a pre-cut length and bent back and forth into the stack-like configuration. Additional disclosure regarding continuous sheet electrocaloric articles can be found in PCT published application no. WO2017/111916 A1, and in U.S. patent application Ser. No. 62/722,736, the disclosures of both of which are incorporated herein by reference in their entirety. Also, the stack of FIG. 2 or other electrocaloric heat transfer devices can be arranged in a cascade with other electrocaloric heat transfer devices such as disclosed in US Patent Pub. No. 2017/0356679 A1, the disclosure of which is incorporated herein by reference in its entirety.

As mentioned above, the electrocaloric module includes an electrocaloric material, such as an electrocaloric film that can be formed into a stack-like structure. Examples of electrocaloric materials for the electrocaloric film can include but are not limited to inorganic (e.g., ceramics) or organic materials such as electrocaloric polymers, and polymer/ceramic composites. Composite materials such as organic polymers with inorganic fillers and/or fillers of a different organic polymer. Examples of inorganic electrocaloric materials include but are not limited to $PbTiO_3$ ("PT"), $Pb(Mg_{1/3}Nb_{2/3})O_3$ ("PMN"), PMN-PT, $LiTaO_3$, barium strontium titanate (BST) or PZT (lead, zirconium, titanium, oxygen). Examples of electrocaloric polymers include, but are not limited to ferroelectric polymers, liquid crystal polymers, and liquid crystal elastomers. Ferroelectric polymers are crystalline polymers, or polymers with a high degree of crystallinity, where the crystalline alignment of polymer chains into lamellae and/or spherulite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers. In some embodiments, the electrocaloric film can include a polymer composition according to WO 2018/004518 A1 or WO 2018/004520 A1, the disclosures of which are incorporated herein by reference in their entirety.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied. In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers. Electrodes on the electrocaloric film can take different forms with various electrically conductive components. The electrodes can be any type of conductive material, including but not limited to metallized layers of a conductive metal such as aluminum or copper, or other conductive materials such as carbon (e.g., carbon nanotubes, graphene, or other conductive carbon). Noble metals can also be used, but are not required. Other conductive materials such as a doped semiconductor, ceramic, or polymer, or conductive polymers can also be used. In some embodiments, the electrodes can be in the form of metalized layers or patterns on each side of the film such as disclosed in published PCT application WO 2017/111921 A1 or U.S. patent application 62/521,080, the disclosures of each of which is incorporated herein by reference in its entirety.

In some embodiments, electrocaloric film thickness can be in a range having a lower limit of 0.1 µm, more specifically 0.5 µm, and even more specifically 1 µm. In some embodiments, the film thickness range can have an upper limit of 1000 µm, more specifically 100 µm, and even more specifically 10 µm. It is understood that these upper and lower range limits can be independently combined to disclose a number of different possible ranges. Within the above general ranges, it has been discovered that thinner films can promote efficiency by reducing parasitic thermal losses, compared to thicker films.

Figure 3:
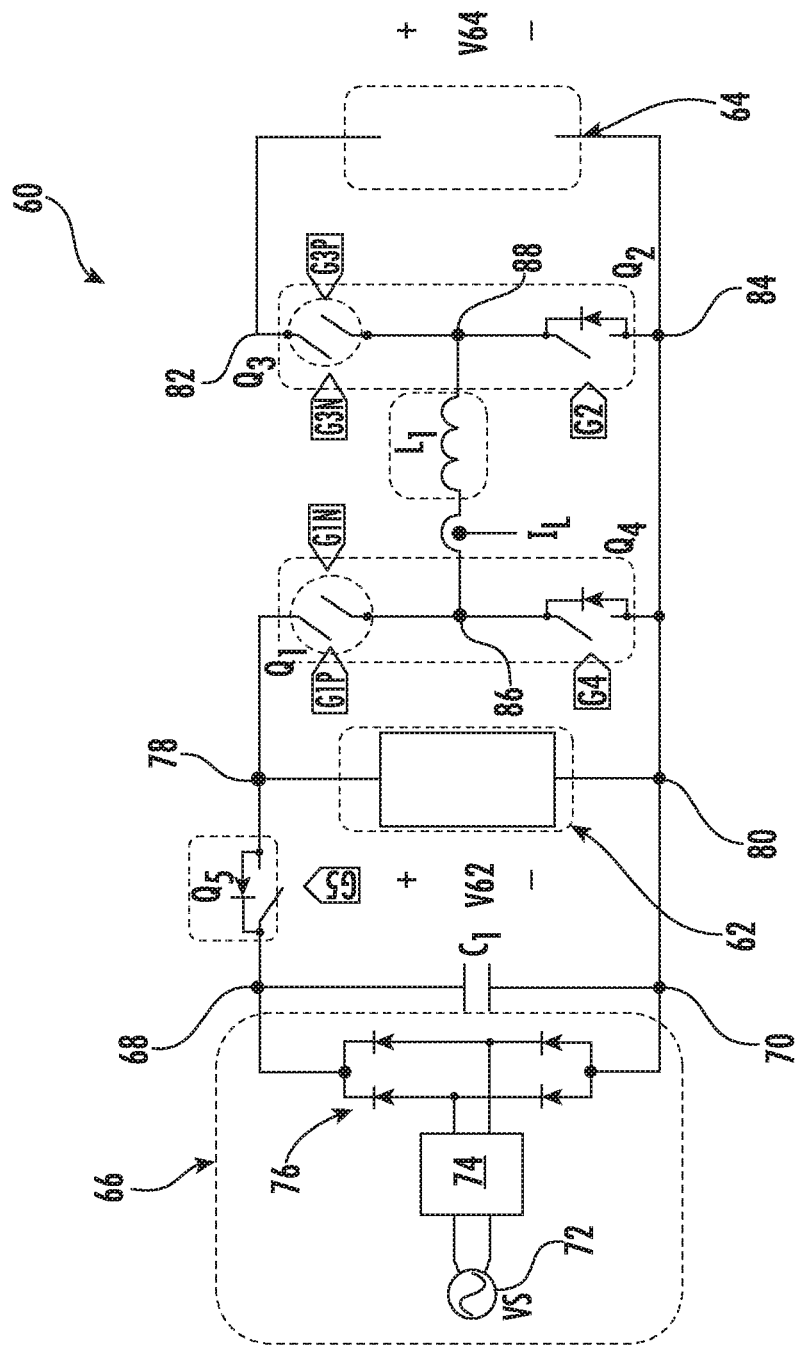
FIG. 3 schematically shows an electrical diagram for two electrocaloric modules and a bi-directional power transfer circuit.

As mentioned above, the heat transfer systems disclosed herein include a bi-directional power transfer circuit to transfer power between electrocaloric modules. An example embodiment of a configuration with a bi-directional power transfer circuit is shown in FIG. 3. As shown in FIG. 3, electrocaloric modules 62 and 64 (e.g., a thin-film stack-like configuration of thin electrocaloric films with electrodes and fluid flow path(s) in thermal and fluid communication with the films such as shown in FIGS. 1 and 2) are connected by a bi-directional power transfer circuit 60. The first electrocaloric module includes a first electrocaloric material, a first high-side voltage electrode, and a first low-side voltage electrode, arranged to impart an electric field to the first electrocaloric material, and the second electrocaloric module includes a second electrocaloric material, a second high-side voltage electrode, and a second low-side voltage electrode, arranged to impart an electric field to the second electrocaloric material. The first and second electrocaloric materials can be the same as each other or different, and the other components (e.g., electrodes) can the same or different between the first and second modules. In some embodiments, the electrocaloric modules are identical or matched to provide equivalent performance to facilitate out of phase synchronized operation in connection with a single heat source and heat sink. An electric power source 66 provides a voltage difference Vs between a high-side voltage (e.g., a positive voltage) at junction 68 and a low-side voltage (e.g., a negative or neutral voltage) at junction 70. The power source is shown as a household alternating current voltage source 72 with an EMI filter 74 and diode bridge 76, but can be any type of direct current power supply including single phase or 3-phase voltage sources with diode rectifier. A snubber capacitor C1 is connected in series across the power source terminals 68 and 70, and a connect/disconnect switch Q5 is disposed in series between the high-side terminal 68 and the electrocaloric modules 62/64. A high-side switch Q1 and a low-side switch Q4 are connected in series across a high-side terminal 78 and low-side terminal 80 of the electrocaloric module 62, and a high-side switch Q3 and a low-side switch Q2 are connected in series across a high-side terminal 82 and low-side terminal 84 of the electrocaloric module 62. An inductor L1 is connected to junction 86 between the high-side and low-side switches Q1 and Q4 on one side, and junction 88 between the high-side and low-side switches Q3 and Q2 on the other side. Switching devices Q1-Q4 are shown as gated transistors (e.g., insulated gate bipolar transistors (IGBT)), but can be any type of controllable switch can be used, including but not limited to MOSFET, SiC MOSFET, GaN, MOS-controlled thyristor, or gate-controlled thyristor devices. Gated control functionality for the switches is represented in FIG. 3 by G1P/G1N for Q1, G4 for Q4, G3P/G3N for Q3, and G2 for Q2, with control provided by a controller such as 324 (FIG. 1)(not shown in FIG. 3).

Each of the switch devices Q2 and Q4 include a diode bypass oriented to permit low-side to high-side current flow and to prevent high-side to low-side current flow. The switch devices Q1 and Q3 are configured as dual-gated bi-directional switches, but any type of controllable switch can be used, including but not limited to a diode bypass oriented.

Figure 4A:
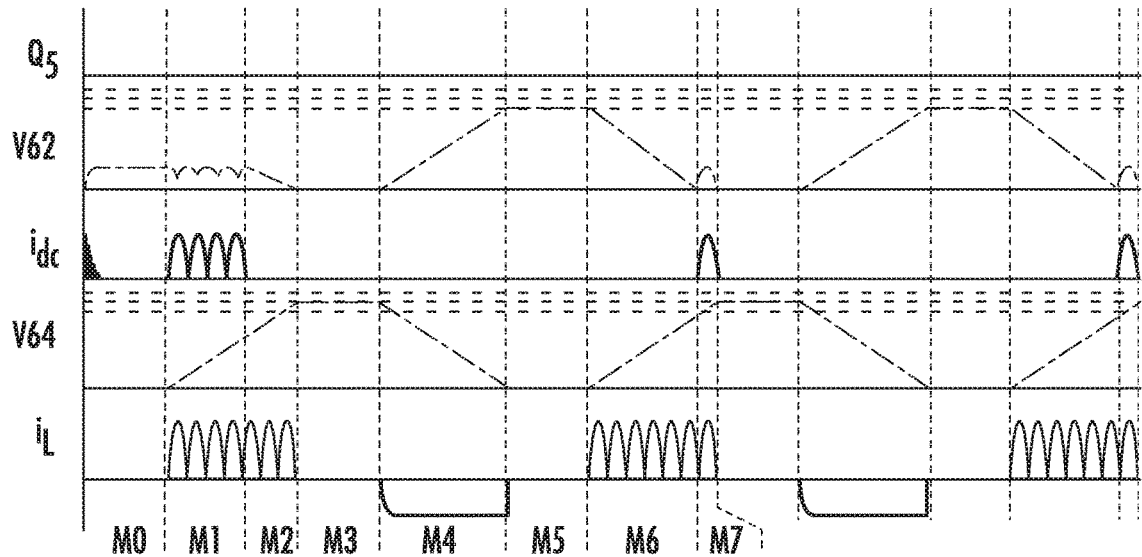
FIGS. 4A and 4B each shows a plot of voltage and current parameters and switch settings for a heat transfer system with electrocaloric films or modules and a bi-directional power transfer circuit with an AC power source or a DC power source, respectively.
Figure 4B:
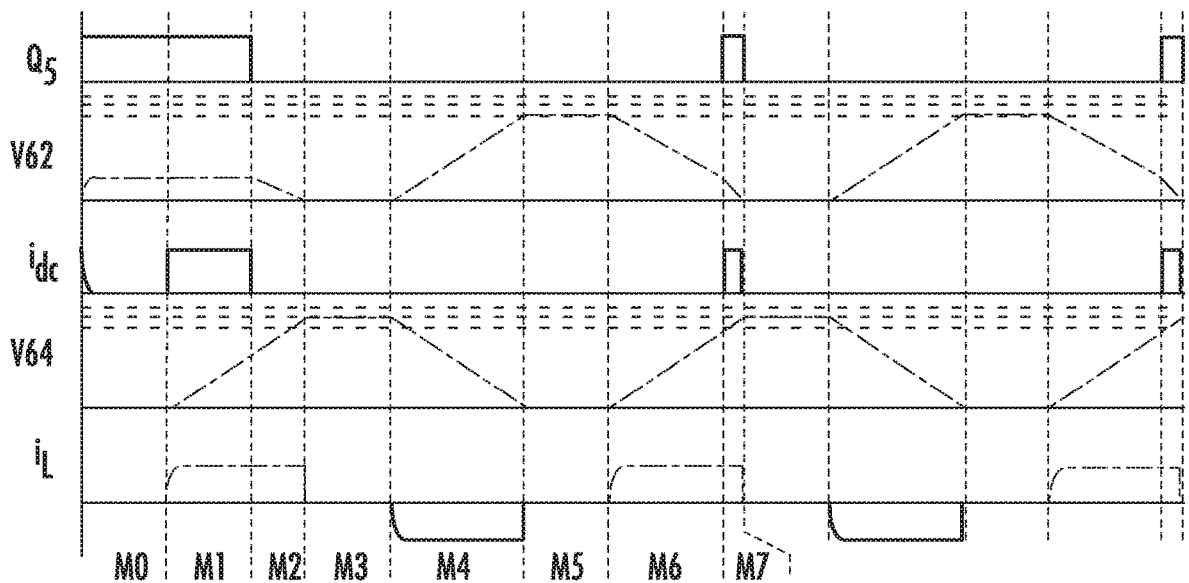
Figure 5A:
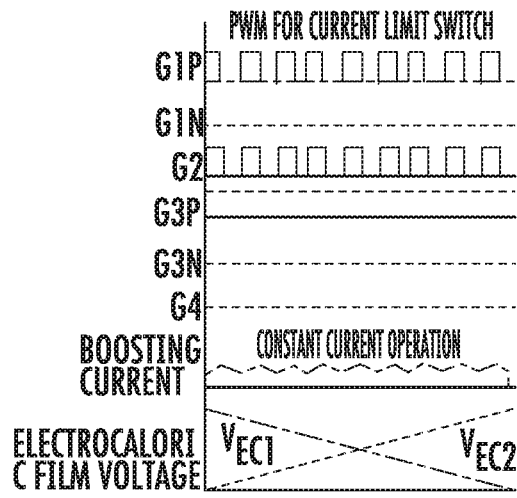
FIGS. 5A and 5B each show operation of switches in a bi-directional power transfer circuit, along with current and voltage during specified operational states of the heat transfer system.
Figure 5B:
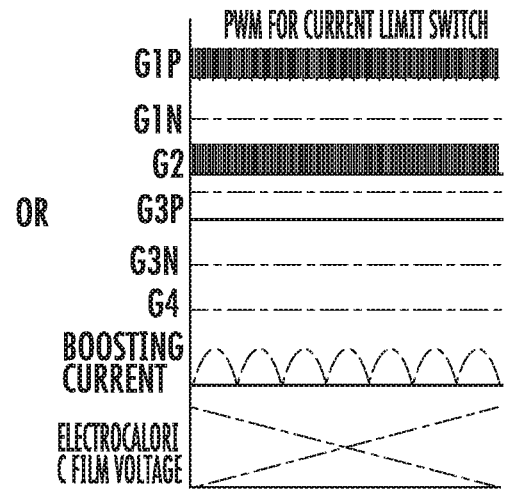

The electrical operation of a heat transfer system as shown in FIG. 3 is described below with regard to FIGS. 4A/4B, 5A/5B, and 6A/6B. These Figures show an example embodiment of an operating protocol in stages M0-M7, with stages M0-M2 showing a start-up protocol and stages M3-M7 showing a repeating protocol for steady state operation. More specifically, the stages are described as follows: M0: pre-charging; M1: EC2 charging, power transfer from Vs to EC1; M2: EC2 charging, power transfer from EC1 to EC2; M3: dwell time, no power transfer; M4: EC2 discharging & EC1 charging, power transfer from EC2 to EC1; M5: dwell time, no power transfer; M6: EC2 charging, power transfer from EC1 to EC2; and M7: EC2 charging, power transfer from Vs to EC1. FIG. 4A shows the operation based on AC source that can be natural power factor correction because the electrocaloric module has low capacitance compared to conventional DC link voltage capacitor. FIG. 4B shows the operation based on DC source. FIGS. 4A/4B shows a plot of voltage (V62) across the electrodes of the electrocaloric module 62, voltage (V64) across the electrodes of the electrocaloric module 64, current output from the power source 66 ($I_{DC}$), and boosting current ($I_L$) through the inductor L1, along with the position of switch Q5. At the pre-charging stage M0, the switches Q1-Q4 are open and switch Q5 is closed to provide current from the power source 66 to the electrodes of electrocaloric module 62, which begin to charge. At stage M1, the switch Q5 remains closed to continue transfer of power from the power source 66 to the electrocaloric module 62, the switch Q3 is switching to avoid resonance current, and the switches Q1 and Q2 are also switching to begin charging the electrodes of the electrocaloric module 64. Operation during stages M1, M2, M6, and M7 is further shown in FIGS. 5A/5B, where it can be seen that switches Q1 and Q2 are switched together between open and closed positions to control the current level $I_L$. In FIG. 5A, the switches Q1/Q2 are toggled in a pulse width modulation pattern (PWM) configured to provide a relatively constant current $I_L$, and in FIG. 5B, the switches Q1/Q2 are toggled in a different pulse width modulation pattern configured to provide current $I_L$ with a sine wave pattern. The PWM toggling of the switches Q1/Q2 also controls the current level $I_{DC}$ in a sine wave pattern during stage M1 as shown in FIG. 4A, but the duration of the subsequent stages with power transfer from the power source 66 (M7) are of short duration so that no sine wave pattern is shown beyond a single wave (although current control from toggling of the switches Q1/Q2 may still be occurring). In addition, if the power source 66 is a DC power source, the PWM toggling of the switches Q1/Q2 also controls the current level $I_{DC}$ in a DC current and constant voltage during stage M1 as shown in FIG. 4B.

Figure 6A:
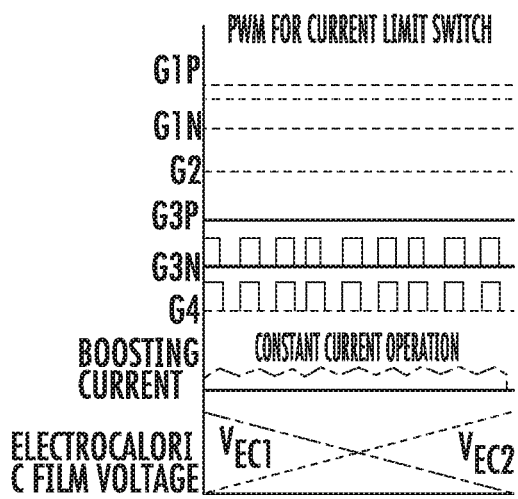
FIGS. 6A and 6B each show operation of switches in a bi-directional power transfer circuit, along with current and voltage during specified operational states of the heat transfer system.
Figure 6B:
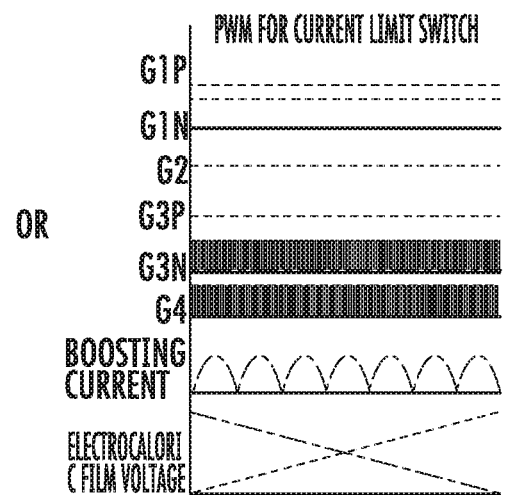

With continued reference to FIGS. 4A/4B, the switch Q5 is opened at stage M2 to discontinue power transfer from the power source 66, while switch Q3 remains closed with switch Q4 open, and the toggling of switches Q1/Q2 is continued to control the transfer of power from the electrodes of the electrocaloric module 62 to the electrodes of the electrocaloric module 64 through the inductor L1. At stage M3, all of the switches Q1-Q4 are opened, and the electrocaloric module 64 is held at a constant voltage. During the stage M3, the electrocaloric material of the electrocaloric module 64 can be placed in operative thermal communication with a heat sink (not shown) (e.g., through fluid communication with a working fluid that is in fluid/thermal communication with a heat sink, e.g., outside air for an air conditioning system) to remove heat from the activated electrocaloric material. As the electrocaloric material in electrocaloric module 64 reaches or approaches a thermal equilibrium with the heat sink, the electrodes of the electrocaloric module 64 can be deactivated to cause a reduction in temperature of the electrocaloric material in electrocaloric module 64, and the electrodes of the electrocaloric module 62 can be charged to activate the electrocaloric material in electrocaloric module 62. This is shown in FIGS. 4A/4B for stage M4, the operational details of which are shown in FIGS. 6A/6B. As shown in FIGS. 4A/4B and 6A/6B, the switch Q1 is switching to avoid resonance current, while the switches Q3/Q4 are toggled together between open and closed positions to control the current flow $I_L$ using pulse width modulation to produce a constant current (FIG. 6A) or a sine wave current (FIG. 6B).

At stage M5, the system reaches another hold time period during which all switches can be opened while heat is transferred from the electrocaloric material of the electrocaloric module 62 to the heat sink, and heat is transferred from a heat source (e.g., an indoor conditioned space for air conditioning operation) to the electrocaloric material of the electrocaloric module 64. As the electrocaloric material in electrocaloric module 62 reaches or approaches a thermal equilibrium with the heat sink and/or the electrocaloric material in electrocaloric module 64 reaches or approaches a thermal equilibrium with the heat source, the electrodes of the electrocaloric module 62 can be deactivated to cause a reduction in temperature of the electrocaloric material in electrocaloric module 64, while the electrodes of the electrocaloric module 64 can be charged to activate the electrocaloric material in electrocaloric module 64. This is accomplished at stage M6 where switch Q3 is closed, switch Q4 is open, and switches Q1 and Q2 are toggled together between open and closed positions to control the current level $I_L$, with operational details shown in FIGS. 5A/5B. At stage M7, switch Q5 is closed while switches Q1/Q2 are toggled to provide power transfer from the power source 66 to the electrocaloric module 62 to account for energy consumption from the electrocaloric modules.

As mentioned above, the stages M3-M7 can be repeated for a steady state operation, in which case each of the electrocaloric modules 62/64 can be alternately placed into thermal communication with the heat source or heat sink in a synchronized manner out of phase. In some embodiments, the electrocaloric modules 62/64 can be physically oriented with fluid flow connections to a heat sink and heat source to facilitate alternating of the fluid flow paths in a back-and-forth regenerative manner, as disclosed by US patent application publication nos. 2017/0045258A1, 2017/0356679A1, or 2017/0356680A1, the disclosures of each of which are incorporated herein by reference in their entirety. In some embodiments, the bi-directional power transfer circuit configurations disclosed herein including disposed in both the high-voltage connection and the low-voltage connection to a power transfer inductor can promote controlled current flow through the circuit.

Figure 7:
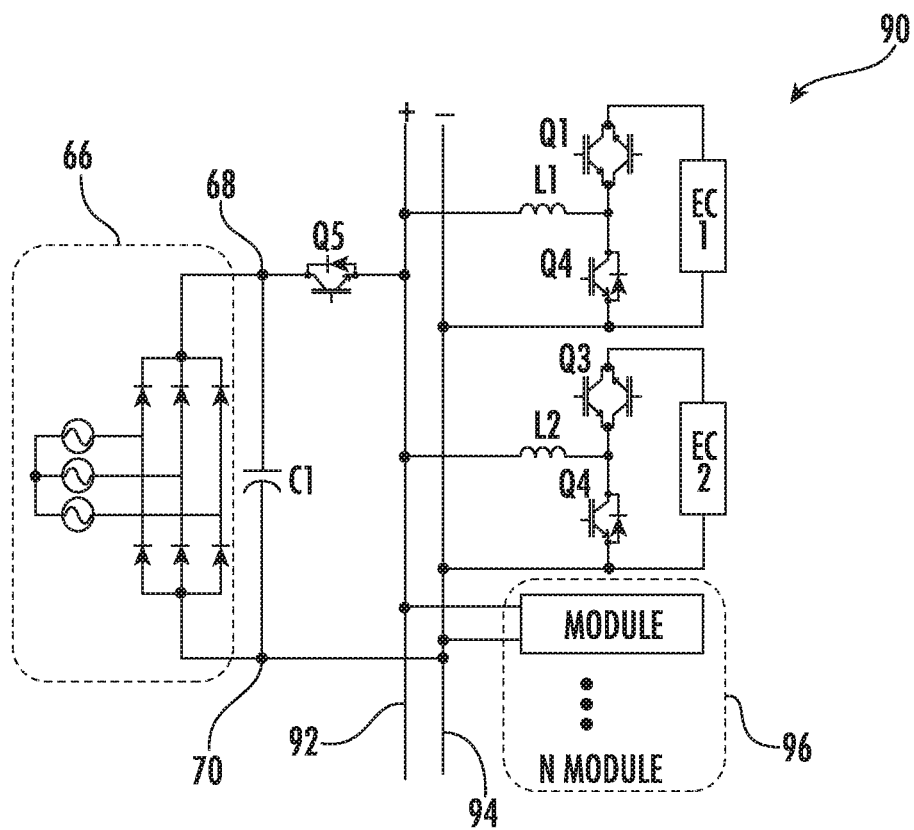
FIG. 7 schematically shows an electrical diagram for a plurality of electrocaloric modules and a bi-directional power transfer circuit.

It is further noted that the circuit configuration of FIG. 3 is an example embodiment that is representative, not limiting, and that variations and modifications can be included. For example, FIG. 3 shows a system with two electrocaloric modules in which power transfer from the electric power source 66 is directed to the electrocaloric module 62. Another example embodiment that can accommodate any number of a plurality of electrocaloric modules is shown in FIG. 7, which uses the same numbering from FIG. 3 to describe like components without the need for further detailed explanation. As shown in FIG. 7, a high-side voltage bus 92 (e.g., a positive voltage bus) is connected to through the switch Q5 to the high-side terminal 68, and a low-side voltage bus 94 (e.g., a neutral or negative voltage bus) is connected to the low-side terminal 70. Electrocaloric modules 62 and 64 are each connected to the high-side voltage bus 94 through inductors L1 and L2, and are also connected to the low-side voltage bus 96, through high-side low-side switches Q1-Q4 analogous to the switches Q1-Q4 of FIG. 3. Additionally any number of additional modules (i.e., "n" modules) 96 can be similarly connected with similarly-disposed inductors and high-side and low-side switches. The system shown in FIG. 7 can be operated with switching and heat transfer as described above for FIG. 3.

Although any directions described herein (e.g., "up", "down", "top", "bottom", "left", "right", "over", "under", etc.) are considered to be arbitrary and to not have any absolute meaning but only a meaning relative to other directions. For convenience, unless otherwise indicated, the terms shall be relative to the view of the Figure shown on the page, i.e., "up" or "top" refers to the top of the page, "bottom" or "under" refers to the bottom of the page, "right" to the right-hand side of the page, and "left" to the left-hand side of the page.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A heat transfer system, comprising:
    a first electrocaloric module comprising a first electrocaloric material, a first high-side voltage electrode, and a first low-side voltage electrode, arranged to impart an electric field to the first electrocaloric material;
    a second electrocaloric module comprising a second electrocaloric material, a second high-side voltage electrode, and a second low-side voltage electrode, arranged to impart an electric field to the second electrocaloric material;
    a bi-directional power transfer circuit arranged to alternately transfer power from the electrodes of the first electrocaloric module to the second electrocaloric module, and from the electrodes of the second electrocaloric module to the first electrocaloric module, said bi-directional power transfer circuit comprising an inductor disposed between and in operative electrical communication with the electrodes of the first and second electrocaloric modules, a first high-side switch in an electrical connection between the first high-side voltage electrode and the inductor, a first low-side switch in an electrical connection between the first low-side voltage electrode and the inductor, a second high-side switch in an electrical connection between the second high-side voltage electrode and the inductor, and a second low-side switch in an electrical connection between the second low-side voltage electrode and the inductor; and
    an electric power source comprising a high-side voltage connection and a low-side voltage connection, in operative electrical communication with one or more of: the electrodes of first electrocaloric module, the electrodes of second electrocaloric module, or the bi-directional power transfer circuit.

2. The heat transfer system of claim 1, further comprising a first low-side diode connected in parallel with the first low-side switch and oriented to conduct current from the first low-side voltage electrode to the first high-side voltage electrode, and a second low-side diode connected in parallel with the second low-side switch and oriented to conduct current from the second low-side voltage electrode to the second high-side voltage electrode.

3. The heat transfer system of claim 1, further comprising a first high-side diode connected in parallel with the first high-side switch and oriented to conduct current from the first low-side voltage electrode to the first high-side voltage electrode, and a second high-side diode connected in parallel with the second high-side switch and oriented to conduct current from the second low-side voltage electrode to the second high-side voltage electrode.

4. The heat transfer system of claim 1, further comprising an electric power source switch disposed in an electrical connection between the high-side voltage connection of the electric power source and the first and second electrocaloric modules.

5. The heat transfer system of claim 4, further comprising a power source diode connected in parallel with the power source switch and oriented to conduct current from the first and second electrocaloric modules to the high-side voltage connection.

6. A heat transfer system, comprising:
    a plurality of electrocaloric modules each individually comprising an electrocaloric material, a high-side voltage electrode, and a low-side voltage electrode arranged to impart an electric field to the electrocaloric material;
    a high-side voltage bus connected to the high-side voltage electrode of each electrocaloric module of the plurality of electrocaloric modules;
    a low-side voltage bus connected to the low-side voltage electrode of each electrocaloric module of the plurality of electrocaloric modules;
    and a plurality of bi-directional power transfer circuits between each electrocaloric module of the plurality of electrocaloric modules and the high-side voltage bus and the low-side voltage bus, each bi-directional power transfer circuit comprising a high-side switch and a low-side switch connected in series between the electrocaloric module high-side voltage electrode and low-side voltage electrode, an inductor in an electrical connection between the high-side voltage bus and a junction disposed between the high-side switch and the low-side switch, and an electrical connection between the low-side voltage electrode and the low-side voltage bus.

7. The heat transfer system of claim 6, wherein the power source switch is between the power source high-side voltage connection and the high-side voltage bus.

8. The heat transfer system of claim 1, further comprising a capacitor in an electrical connection between the electric power source high-side and low-side voltage connections, in parallel with electrical connections to the high-side and low-side voltage electrodes of the first and second electrocaloric modules.

9. A method of operating the heat transfer system of claim 1, comprising
    (a) applying a voltage differential to the electrodes of the first electrocaloric module to activate the first electrocaloric material;
    (b) transferring heat from the activated first electrocaloric material to a heat sink;
    (c) transferring electric power from the first electrocaloric module electrodes to the second electrocaloric module electrodes through the bi-directional power transfer circuit to deactivate the first electrocaloric material and activate the second electrocaloric material; and (d) transferring heat from a heat source to the deactivated first electrocaloric material, and transferring heat from the activated second electrocaloric material to the heat sink.

10. The method of claim 9, further comprising transferring electric power from the power source to either or both of the first electrocaloric module electrodes or the second electrocaloric module electrodes.

11. The method of claim 9, further comprising:
(e) transferring electric power from the second electrocaloric module electrodes to the first electrocaloric module electrodes through the bi-directional power transfer circuit to deactivate the second electrocaloric material and activate the first electrocaloric material; and
(f) transferring heat from the heat source to the deactivated second electrocaloric material, and transferring heat from the activated first electrocaloric material to the heat sink.

12. The method of claim 11, further comprising repeating steps (c)-(f).

13. The method of claim 9, wherein the step (c) includes closing the second high-side switch, opening the first low-side switch, closing the first high-side switch, and closing the second low-side switch.

14. The method of claim 13, further comprising toggling the first high-side switch together with the second low-side switch between open and closed positions.

15. The method of claim 14, wherein the first high-side switch and the second low-side switch are toggled together between open and closed positions in a pulse width modulation pattern to produce a constant current through the inductor.

16. The method of claim 14, wherein the first high-side switch and the second low-side switch are toggled together between open and closed positions in a pulse width modulation pattern to produce a sine wave current through the inductor.

17. The method of claim 11 wherein the step (e) includes closing the first high-side switch, opening the second low-side switch, closing the second high-side switch, and closing the first low-side switch.

18. The method of claim 17, further comprising toggling the second high-side switch together with the first low-side switch between open and closed positions.

19. The method of claim 18, wherein the second high-side switch and the first low-side switch are toggled together between open and closed positions in a pulse width modulation pattern to produce a constant current through the inductor.

20. The method of claim 18, wherein the second high-side switch and the first low-side switch are toggled together between open and closed positions in a pulse width modulation pattern to produce a sine wave current through the inductor.

* * * * *